(12) United States Patent
Karlsson et al.

(10) Patent No.: US 10,935,582 B2
(45) Date of Patent: Mar. 2, 2021

(54) DETERMINING THE EQUIVALENT SERIES RESISTANCE OF A POWER CONVERTER

(71) Applicant: Telefonaktiebolaget LM Ericsson (publ), Stockholm (SE)

(72) Inventors: Magnus Karlsson, Oskarshamn (SE); Fredrik Wahledow, Färjestaden (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 371 days.

(21) Appl. No.: 15/778,434

(22) PCT Filed: Nov. 27, 2015

(86) PCT No.: PCT/SE2015/051275
§ 371 (c)(1),
(2) Date: May 23, 2018

(87) PCT Pub. No.: WO2017/091118
PCT Pub. Date: Jun. 1, 2017

(65) Prior Publication Data
US 2018/0348270 A1 Dec. 6, 2018

(51) Int. Cl.
*G01R 27/08* (2006.01)
*H02M 1/14* (2006.01)
*H02M 3/156* (2006.01)

(52) U.S. Cl.
CPC .............. *G01R 27/08* (2013.01); *H02M 1/14* (2013.01); *H02M 3/156* (2013.01)

(58) Field of Classification Search
CPC .................................. H02M 1/14; G01R 27/08
USPC .......................................................... 702/65
See application file for complete search history.

(56) References Cited

U.S. PATENT DOCUMENTS

| | | | |
|---|---|---|---|
| 8,698,469 B1 | 4/2014 | Latham, II et al. | |
| 2010/0127682 A1* | 5/2010 | Kenly ................. | H02M 3/1588 323/282 |
| 2011/0190956 A1* | 8/2011 | Kunst ...................... | G06F 1/28 700/292 |

(Continued)

FOREIGN PATENT DOCUMENTS

WO 2017091118 A1 6/2017

OTHER PUBLICATIONS

Singh, Surinder P., "Output Ripple Voltage for Buck Switching Regular", Oct. 31, 2014, XP05528706, pp. 1-16. URL:http://www.ti.com/lit/an/slva630a/slva630a.pdf.

(Continued)

*Primary Examiner* — Eman A Alkafawi
(74) *Attorney, Agent, or Firm* — Boisbrun Hofman, PLLC

(57) ABSTRACT

The invention relates to a device, method, computer program and computer program product for determining the equivalent series resistance of a power converter having power train parameters comprising a capacitance, an inductance and the equivalent series resistance, the device comprising a resistance determining unit that obtains a ripple voltage embedded in an output voltage of the power converter, determines a ripple current based on the output voltage, the inductance and operational switching data of the power converter, and estimates the equivalent series resistance of the power converter based on the ripple voltage, ripple current and the operational switching data.

22 Claims, 4 Drawing Sheets

(56) References Cited

U.S. PATENT DOCUMENTS

2013/0241444 A1    9/2013   Fotherby

OTHER PUBLICATIONS

"Chapter 4, Improved PSM DC-DC Buck Converter", Mar. 3, 2014, pp. 97-130, XP055615691, Retrieved from the Internet: URL: https ://shodhganga.inflibnet.ac.in/bitstream/10603/16441/9/09_chapter4.pdf.
Application No. 15 813 621.8-1201, EPO Communication pursuant to Article 94(3) EPC, dated Sep. 2, 2019, 8 pages.

* cited by examiner

DETERMINING THE EQUIVALENT SERIES RESISTANCE OF A POWER CONVERTER

CROSS-REFERENCE TO RELATED APPLICATION

This application is the National Stage of, and therefore claims the benefit of, International Application No. PCT/SE2015/051275 filed on Nov. 27, 2015, entitled "DETERMINING THE EQUIVALENT SERIES RESISTANCE OF A POWER CONVERTER". The above application is commonly assigned with this National Stage application and is incorporated herein by reference in its entirety.

TECHNICAL FIELD

The present invention relates to the field of load power supply. The invention more particularly relates to a device, method, computer program and computer program product for determining the equivalent series resistance of a power converter.

BACKGROUND

Power converters, such as Switch Mode Power Supplies (SMPS) may be provided for a variety of loads.

Power converters may for instance be provided for high-performance Ultra large-scale integration (ULSI) circuits (e.g. processors, application-specific integrated circuits (ASICs) and Field-Programmable Gate Arrays (FPGAs).

In order to have a high performance in some applications, such as in high performance control loops, it may be necessary to have a good estimate of a power train parameter of the power converter, such as the equivalent series resistance of an output filter.

It is known to estimate the equivalent series resistance using an injection of a disturbance signal. However such an injection may in some cases be undesirable if the application in which the power converter is used is sensitive, such as if the application is radio communication, or if the power converter is to supply loads that require tightly regulated voltages.

It would in view of this be of interest to use an alternative way of determining the equivalent series resistance.

SUMMARY

One object is to provide an alternative way of determining equivalent series resistance of a power converter.

This object is according to a first aspect achieved through a device for determining the equivalent series resistance of a power converter having power train parameters comprising a capacitance, an inductance and the equivalent series resistance. The device comprises a processor and memory. The memory contains computer instructions executable by the processor forming a resistance determining unit, whereby the resistance determining unit is configured to:
obtain a ripple voltage embedded in an output voltage of the power converter,
determine a ripple current based on the output voltage, the inductance and operational switching data of the power converter, and
estimate the equivalent series resistance of the power converter based on the ripple voltage, ripple current and the operational switching data.

The object is according to a second aspect achieved through a method for determining the equivalent series resistance of a power converter having power train parameters comprising a capacitance an inductance and the equivalent series resistance. The method is performed in a resistance determining unit for the power converter and comprises
obtaining a ripple voltage embedded in an output voltage of the power converter,
determining a ripple current based on the output voltage, the inductance and operational switching data of the power converter, and
estimating the equivalent series resistance of the power converter based on the ripple voltage, ripple current and the operational switching data.

The object is according to a third aspect achieved by a computer program for determining the equivalent series resistance of a power converter having power train parameters comprising
a capacitance, an inductance and the equivalent series resistance.

The computer program comprises computer program code which when run in a resistance determining unit of a resistance determining device causes the resistance determining unit to:
obtain a ripple voltage embedded in an output voltage of the power converter, said ripple components forming a ripple voltage,
determine a ripple current based on the output voltage, the inductance and operational switching data of the power converter, and
estimate the equivalent series resistance of the power converter based on the ripple voltage, ripple current and the operational switching data.

The object is according to a fourth aspect furthermore achieved through a computer program product for determining the equivalent series resistance of a power converter. The computer program product is provided on a data carrier and comprises the computer program code according to the third aspect.

There are several advantages associated with the above-mentioned aspects. It enables a better performance to be obtained, such as in high performance control loops. The determination of the equivalent series resistance may furthermore be made fast and efficiently.

According to one variation of the first aspect, the resistance determining unit is configured to estimate the resistance based on a first simplification of an expression defining the dependency between the ripple current, the output voltage, operational switching data and the equivalent series resistance. The first simplification defines the resistance as the ripple voltage divided by the ripple current.

According to a corresponding variation of the second aspect, the estimating of the resistance is based on a first simplification of an expression defining the dependency between the ripple current, the output voltage, operational switching data and the equivalent series resistance. The first simplification defines the resistance as the ripple voltage divided by the ripple current.

According to another variation of the first aspect, the resistance determining unit is configured to perform the estimating of the resistance using the first simplification if a time constant is assumed to be higher than two estimated time constants. The time constant is formed by the resistance and capacitance and the estimated time constants correspond to on and off times in switching performed in the power converter depending on the operational switching data.

According to a corresponding variation of the second aspect, the estimating of the resistance using the first simplification is made if a time constant is assumed to be higher than two estimated time constants. Here the time constant is formed by the resistance and capacitance and the estimated time constants correspond to on and off times in switching performed in the power converter depending on the operational switching data.

According to a further variation of the first aspect, the estimating of the resistance is made using a second simplification if the time constant is assumed to be lower than both the estimated time constants and the resistance determining unit is further configured to, after having estimated the resistance according to a simplification, investigate if the assumption was correct using the calculated resistance, and if it was not, use another simplification.

According to a corresponding variation of the second aspect, the the estimation is made using a second simplification if the time constant is assumed to be lower than both the estimated time constants. After having estimated the resistance according to a simplification, there is furthermore an investigation of if the assumption was correct using the calculated resistance, and if it was not, another simplification is used.

In a further variation of the first aspect, the resistance determining unit is configured to use a further simplification of the equation if the time constant is assumed to be higher than one of the estimated time constants, but lower than the other.

In a corresponding variation of the second aspect, the method comprises using a further simplification of the equation if the time constant is assumed to be higher than one of the estimated time constants, but lower than the other.

In yet another variation of the first and second aspects, the operational switching data comprises the duty cycle and the switching period, where the on time is equal to the switching period times the duty cycle and the off time is equal to the switching period times the difference between one and the duty cycle.

In yet a further variation of the first and second aspects the expression comprises a first term defining a difference between a first parameter and a second parameter and a second term defining a difference between a third parameter and the second parameter, where the first parameter depends on the off time, the second parameter depends on the time constant and the third parameter depends on the on time.

In another variation of the first and second aspects the first simplification comprises an expression that depends on the switching frequency, the inductance and the output voltage. The expression is stored as a constant in a constant store.

In a further variation of the first and second aspects, the determining of the resistance is made using an ideal duty cycle that is based on an output input voltage ratio. In this case the constant also has a dependency on the input voltage.

In yet a further variation of the first aspect, the resistance determining unit is configured to obtain ripple components of the output voltage through locating the maximum and minimum values of ripple voltage values stored in a ripple storing buffer during the operation of the power converter and to form the ripple voltage as the difference between the maximum and minimum values.

In a corresponding variation of the second aspect, the obtaining of a ripple voltage comprises obtaining ripple components of the output voltage through locating maximum and minimum values of ripple voltage values stored in a ripple storing buffer during the operation of the power converter and forming the ripple voltage as the difference between the maximum and minimum values.

The device may further comprise the converter.

It should be emphasized that the term "comprises/comprising" when used in this specification is taken to specify the presence of stated features, integers, steps or components, but does not preclude the presence or addition of one or more other features, integers, steps, components or groups thereof.

BRIEF DESCRIPTION OF THE DRAWINGS

Embodiments of the invention will now be explained in detail, by way of example only, with reference to the accompanying figures, in which.

DETAILED DESCRIPTION

The invention is concerned with a device for determining the equivalent series resistance of a power converter. Both the equivalent series resistance determining device and the power converter may be a part of a power supply device. A power supply device may with advantage be provided as a part of an Intermediate Bus Architecture (IBA). In the following it will be described in relation to this environment. It should however be realized that the power supply device is in no way limited to this particular environment but may be used in any type of power supply environment.

IBA power supply systems are of interest to use for supplying power to loads such as high-performance Ultra-Large Scale Integration (ULSI) circuits (e.g. processors, application-specific integrated circuits (ASICs) and Field-Programmable Gate Arrays (FPGAs)). These circuits may furthermore be provided in communication networks, such as telecommunication networks, where the communication networks may furthermore be wireless communication networks such as Long Term Evolution (LTE) or Wideband Code Division Multiple Access (WCDMA) communication networks. The loads may for instance be provided as circuits in a base station, often termed nodeB or enodeB, a Gateway GPRS Support Node (GGSN) or a Serving GPRS Support nodes (SGSN), where GPRS in an acronym for Global Packet Radio Access.

Figure 1:
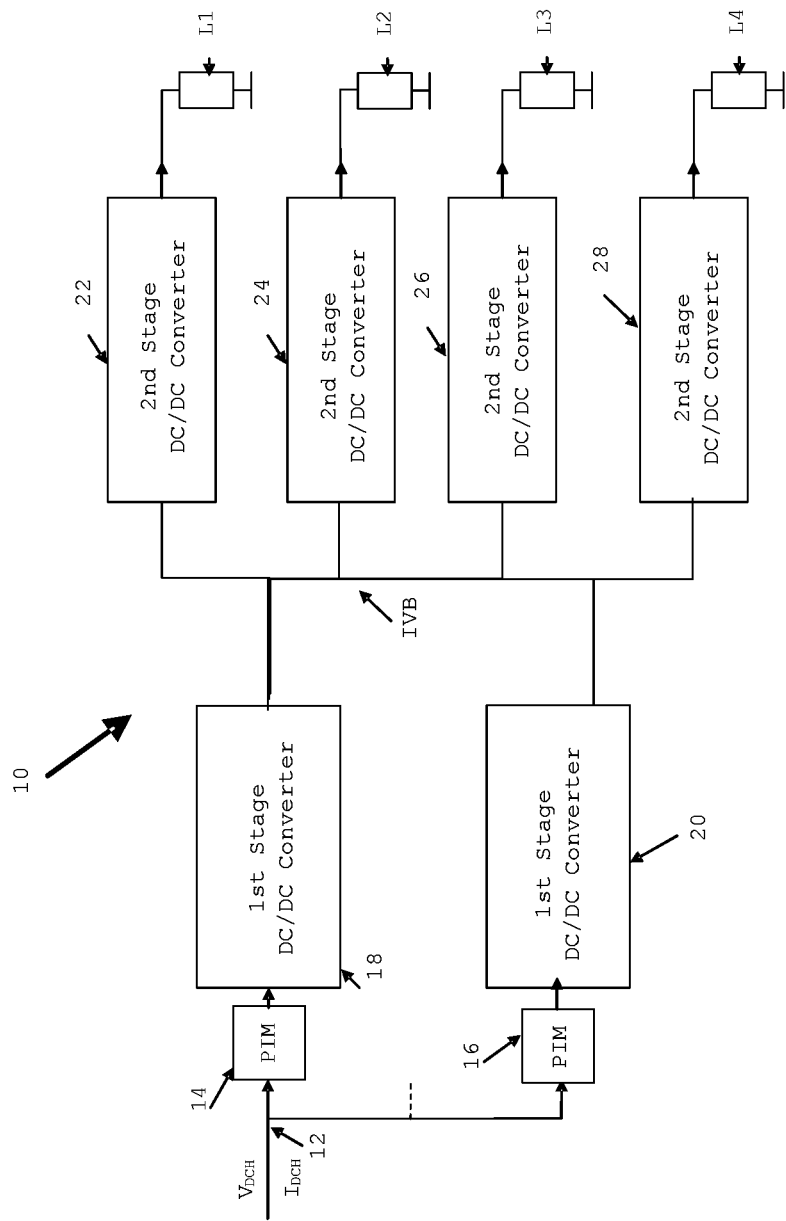
FIG. 1 is a schematic of an intermediate Bus Architecture power system comprising a number of power supply devices.

FIG. 1 is a schematic of one such IBA power system 10. The IBA power system 10 in FIG. 1 is a two-stage power distribution network comprising a number n (where n≥1) of parallel-coupled first stage DC/DC converters 18 and 20, whose outputs are connected via an intermediate voltage bus (IVB) to a number K (where K≥1) of second stage DC/DC converters 22, 24, 26 and 28. The second stage converters are here examples of power supply devices where aspects of the invention may be implemented The first stage converters 18 and 20 are connected to an input power bus at a voltage VDCH, which is typically at a voltage VDCH between 36-75 V, 18-36 V or 18-60 V. Each first stage converter may furthermore be connected to the input power bus via an optional corresponding filtering unit 14 and 16. Such a filtering unit is sometimes referred to as a Power Input Module (PIM). The PIMs (PIM1) 14 and (PIMn) 16 are thus connected to the input power bus and each delivers an OR-ed and filtered mains voltage to the corresponding first stage converter.

Each of the first stage DC/DC converters 18 and 20 is preferably an isolated DC/DC converter. A first stage converter is furthermore often referred to as an Intermediate Bus Converter (IBC). An IBA power supply system having such first stage DC/DC converters or IBCs has the advantage of being efficient and cost-effective to manufacture because isolation from the input power bus, which generally requires the use of relatively costly components including a transformer, is provided by a relatively small number of converters (or, where n=1, by a single converter). Alternatively, the IBCs may be non-isolated from the input power bus. The IBCs are preferably each implemented in the efficient form of a Switched Mode Power Supply (SMPS), which can be fully regulated or line regulated to convert the input power bus voltage to a lower intermediate bus voltage VIB on the IVB. The IBCs may also be fixed ratio converters.

In general, two or more of the IBCs 18 and 20 may be provided in a current sharing arrangement such that they supply power in parallel to second stage DC-to-DC converters.

As shown in FIG. 1, the IBCs are connected via the IVB to the inputs of a number of second stage DC/DC converters 22, 24, 26 and 28. Each of the plurality of second stage DC/DC converters may be a non-isolated POL regulator in the form of an SMPS. However, a second stage DC/DC converter is not limited to such a converter and may alternatively be a non-switched converter, such as a Low Drop Out (LDO) (linear) regulator. Furthermore, some or all of the second stage DC/DC converters may alternatively be isolated but where isolation is provided by the IBCs, it is advantageous from a cost perspective for the second stage DC/DC converters to be non-isolated. Each POL 22, 24, 26 and 28 delivers a regulated output voltage to its load L1, L2, L3 and L4, respectively.

The IBCs and the POLs may have any type of suitable topology and be of any suitably type. They may thus be Buck, Boost, Buck-Boost, etc.

Figure 2:
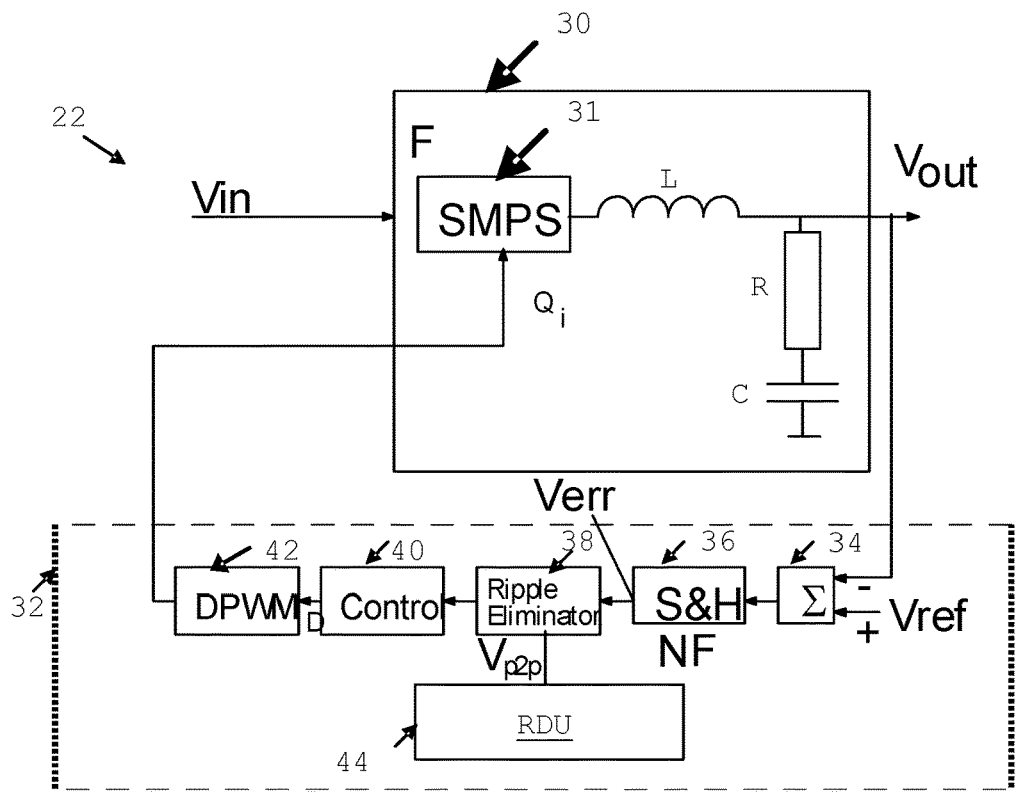
FIG. 2 is a schematic of a power supply device comprising a power converter with a converter control block comprising a resistance determining unit, which power supply device may be provided in the IBA power system of FIG. 1.

FIG. 2 is a schematic view of one way of realizing a power supply device, which power supply device may be one of the above described POLs and in this example the first POL 22 connected to the first load L Alternatively it may be an IBC. The power supply device 22 more particularly comprises a power converter 30 and converter control block 32. The converter control block 32 in turn comprises a resistance determining unit RDU 44. The power supply device 22 may be considered to be a resistance determining device for determining the equivalent series resistance of the power converter 30. However, it should be realized that the converter control block 32 can be separate from the power converter and that as an alternative the converter control block may be considered to be a resistance determining device for determining the equivalent series resistance of the power converter 30. It is in fact also possible that the resistance determining unit 44 may be a separate entity from both the power converter 30 and the rest of the converter control block 32. Consequently the resistance determining unit 44 may also be a resistance determining device for determining the equivalent series resistance of the power converter 30.

The power converter 30 may be an SMPS comprising a power stage 31 comprising a number of switches, which is connected to the converter output via an output filter comprising power train components defining power train parameters. The components comprise a choke having an inductance L and being connected between the power stage 31 and the output of the power converter 30. There is also a series connection of an equivalent series resistance R and a capacitor with capacitance C, where the resistance and capacitor are connected in series with each other as well as in shunt with the choke. Furthermore at least the equivalent series resistance is unknown.

The converter 30 receives an input voltage VI and supplies an output voltage Vout to a load through switching of switches in the power stage 31, where the switching frequency used is F. In the output voltage Vout there is embedded a ripple voltage.

The converter control block 32 is provided in order to control the power converter 30 and therefore it receives measurements of the output voltage and provides a control signal Qi for controlling the power stage 31 of the power converter 30.

In the realization in FIG. 2 the converter control block 32 comprises an error signal forming unit 34, which has a first input receiving the converter output voltage Vout of the power converter 30 and a second input on which it receives a reference voltage $V_{ref}$. The error signal forming unit 34, which may be realized as a subtracting unit, has an output connected to the input of a sample and hold unit 36, which has an output on which it provides an oversampled error signal Verr. The sample and hold unit 36 is arranged to sample the voltage signal at a frequency higher than the switching frequency, F, and temporarily store the sampled values. The sample and hold unit 36 may more particularly oversample the signal voltage by an integer factor N=16. Naturally, the oversampling factor N is not limited to 16 and may take any other user selected integer value. In embodiments where N is an integer and the operation of the sample and hold unit 36 is synchronised with transistor drive signals, N samples of the signal are obtained in each switching period T of the converter 30, with the ith sample in each switching period being spaced apart from the ith sample in the next (or previous) switching period by the switching period T of the converter, and with each of these samples having been obtained at the same time relative to the start of the respective switching period. Thus, the sample and hold unit 36 can be considered to sample and hold N sets of corresponding samples of the error signal, with the sample acquisition times of the samples in each set being spaced apart from one another by the switching period T. The number of samples in each of these sets may also be user selected and can be considered to define a (moving) time window within which corresponding samples are averaged, as explained further below.

The oversampled error signal Verr is supplied to the input of a ripple eliminator unit 38, which has a first output on which it provides a ripple free error signal and a second output on which it provides a peak to peak value of a ripple voltage Vp2p. The ripple free error signal is supplied to the input of a controller 40, which may be a PID regulator. The controller 40 has an output with a signal D, which signal D is a duty cycle for the power converter 30 and being output to a pulse width modulation (PWM) unit 42, which in turn is connected to the converter 30 for controlling the power stage 31 using the control signal Qi. The peak to peak ripple voltage Vp2p is provided to the input of a resistance determining unit RDU 44 for determining the equivalent series resistance.

Figure 3:
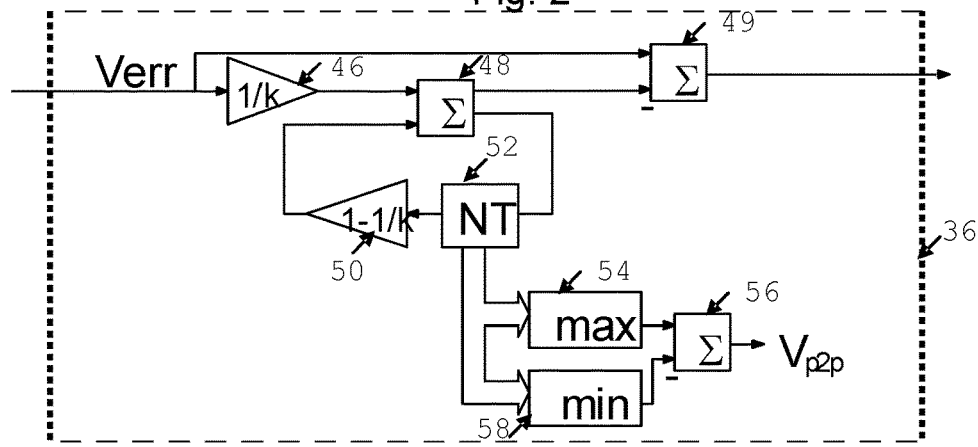
FIG. 3 shows a block schematic of a ripple eliminating unit in the converter control block.

One realization of the ripple eliminator unit 38, which receives the oversampled error signal Verr, is shown in a block schematic in FIG. 3.

The ripple eliminator unit 38 comprises ripple component estimation functionality which is, in general, arranged to estimate ripple components by calculating, for each or some of the samples of the signal that have been received from the sample and hold unit 36, an average sample value (e.g. a mean or a weighted average) using the sample value itself and sample values obtained at corresponding points in preceding switching periods of the converter 30, each of said corresponding points being separated from the sample by a respective integer number of switching periods of the power converter 30. The corresponding points may alternatively be separated from said sample by a respective interval whose length is substantially equal to (i.e. within a tolerance band, such as 2%, 5% or 10%, of) said respective integer number of switching periods. In the present example, the ripple component estimation functionality of the ripple eliminator unit 38 is arranged to calculate a weighted average of the sample values (including the sample value itself) in the time window for each of the aforementioned N sets of samples. In this way, the ripple eliminator 38 is able to obtain a good estimate of what the ripple component should be at any point in time, by exploiting the reproducibility of the ripple from one switching period to the next during stable operation of the converter 30 (when no transients appear). The averaging process suppresses the influence of outlying sample values on the mean sample value, thereby allowing the ripple component to be estimated with relatively high accuracy.

In the present example, the ripple eliminator unit 38 is arranged to estimate the ripple component using an interpolated low-pass filter in the exemplary form of a first-order interpolated recursive moving average filter, as illustrated in FIG. 3. The factor k shown in FIG. 3 is approximately equal to the number of switching periods which are considered in the calculation of the average. It should be noted that the interpolated low-pass filter need not be of first order, but may alternatively be of order 2 or higher.

The interpolated recursive moving average filter in the example of FIG. 3 comprises a first scaling module 46 arranged to receive sample values of the sampled error signal Verr and scale each of the received sample values by a factor 1/k, and a summing module 48—arranged to add each of the scaled sample values to a respective sum of scaled sample values to generate a respective addition result. As shown in FIG. 3, the interpolated recursive moving average filter further comprises a feedback loop that processes the output of the summing module 48 and feeds the processing results back to an input of the summing module 48. In more detail, the feedback loop comprises a delay module 52 (e.g. in the form of a First-In, First-Out (FIFO) buffer, which is arranged to receive the addition results in the order in which the addition results are generated by the summing module 48, to store N of the received addition results at any one time, and to output a stored addition result in response to an addition result being received by the delay module 48 so that the stored addition results are output in the same order as they were received by the delay module 52.

The delay module is shown as being denoted NT, because it is able to store the N samples obtained during the period T. As an alternative to a FIFO register, it is possible to use a circular buffer.

The feedback loop also includes a second scaling module 50, which is arranged to receive the addition results from the delay module 52 in the order in which they are output by the delay module 52, and to scale each received addition result by a factor 1-1/k in order to generate the respective sum of scaled sample values that is to be added to the respective scaled sample value by the summing module 48.

The summing module 48 is also connected to a further subtracting module 49 in order to provide the ripple free output signal, i.e. a signal where the ripple has been removed from the error signal.

There are different ways in which the ripple free error signal may be provided. In the example in FIG. 3, the output of the summing module 48 is connected to a first input of the further subtracting module 49, where a second input of the further subtracting module 49 receives the oversampled error signal Verr. Thereby the ripple is subtracted from the oversampled error signal in order to obtain the ripple free error signal. As an alternative it is possible that the second input is connected to a non-interpolated modified moving average filter having the same construction as the interpolated recursive moving average filter of the ripple eliminator unit 38. The difference could be a difference in the factors used by the scaling modules. The scaling module that receives the oversampled error signal may scale with a factor 1/kN and the scaling module in the feedback loop connected between the output of the delay unit and summing unit may use a scaling factor of 1-1/kN.

The buffer 52 comprises components of the ripple voltage, which are to be used in the determining of the equivalent series resistance. It can be seen that the highest value in the buffer 52 is also provided to a maximum value memory 54 and the lowest value in the buffer 52 to a minimum value memory 58, where the values of these memories are provided to a subtracting element 56 which subtracts the minimum value from the maximum value in order to obtain a peak-to-peak ripple voltage Vp2p. The ripple voltage is thereby formed as the difference between the maximum and minimum ripple values. Here it may also be mentioned that the minimum value memory 58, maximum value memory 54 and subtracting element 56 may as an alternative be a part of the resistance determining unit 44.

The ripple voltage peak to peak value Vp2p is thus estimated by finding the maximum and minimum values in the NT-block 52 and calculating the difference, which thus will be used in the determining of the equivalent series resistance R.

Figure 4:
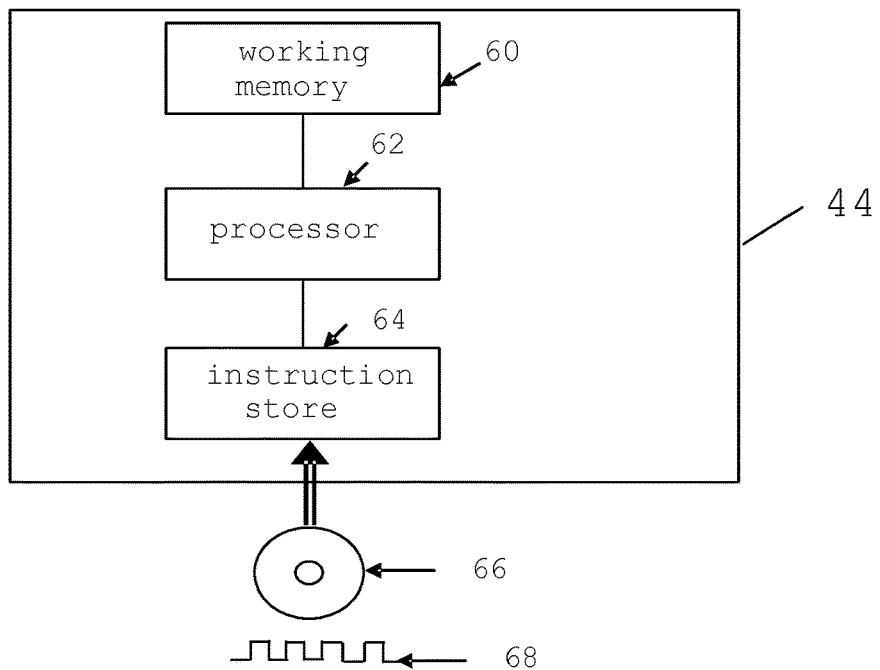
FIG. 4 shows one realization of the resistance determining unit.

FIG. 4 shows one realization of the resistance determining unit 44. It comprises a processor 62, a working memory 60 and an instruction store 64 storing computer-readable instructions which, when executed by the processor 62 cause the processor to perform the processing operations of the resistance determining unit 44. The instruction store 64 may comprise a ROM which is pre-loaded with the computer-readable instructions. Alternatively, the instruction store 64 may comprise a RAM or similar type of memory, and the computer readable instructions can be input thereto from a computer program product, such as a computer-readable storage medium 66 such as a CD-ROM, etc. or a computer-readable signal 68 carrying the computer-readable instructions.

Figure 5:
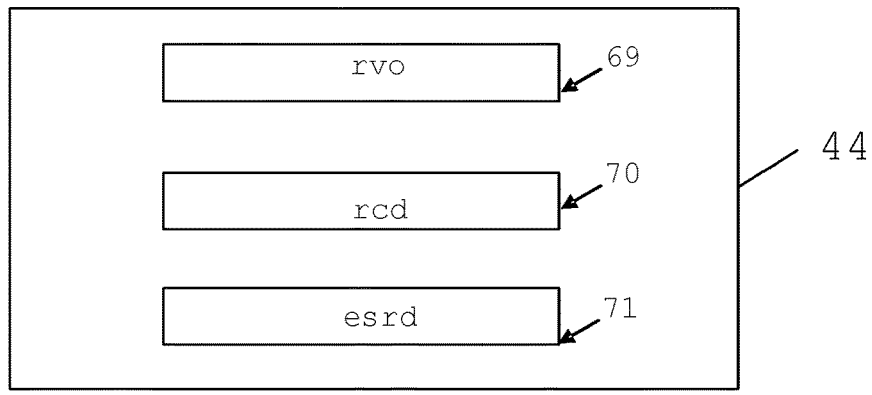
FIG. 5 shows an alternative realization of the resistance determining unit.

FIG. 5 shows an alternative way of realizing the resistance determining unit 44. It may be considered to comprise a ripple voltage obtaining element rvo 69, a ripple current determining element red 70 and an equivalent series resistance determining element esrd 71. These elements may be either hardware or software blocks. Each element may thus be provided as a dedicated circuit such as an Application Specific Integrated Circuit (ASIC) or Field-Programmable Gate Array (FPGA) or a suitable combination of logic circuits. However the element may alternatively be software elements of the above described software instructions.

As described initially the invention is concerned with the problem of determining the equivalent series resistance R of the power converter, i.e. to determine the resistance in series with the capacitor of the output filter. When this resistance R is known the efficiency of the control performed in the control loop can be raised.

Figure 6:
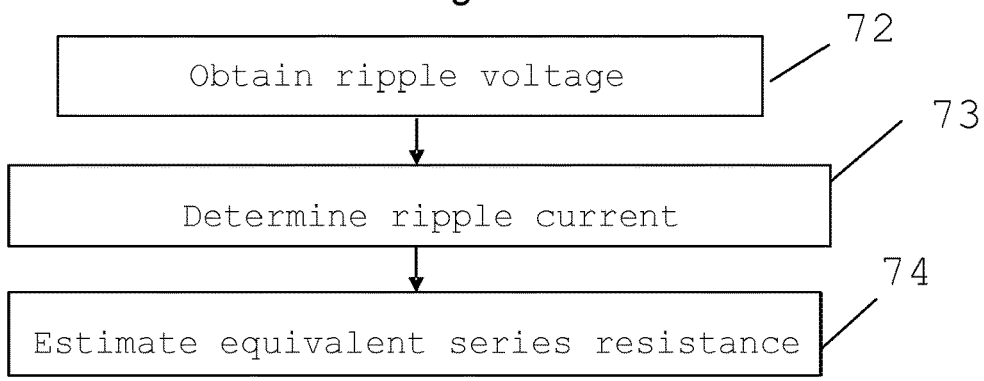
FIG. 6 shows a flow chart of method steps used for determining the equivalent series resistance according to a first embodiment.

Now a first embodiment will be described in relation to FIGS. 2, 3, 5 and 6, where FIG. 6 shows a flow chart of a number of method steps in a method for determining the equivalent series resistance of the power converter 30. This determination is performed by the resistance determining unit 44.

The converter 30 provides an output voltage Vout that is supplied to the load, which output voltage Vout has ripple components.

In order to determine the determining the resistance, the ripple voltage obtaining element 69 of the resistance determining unit 44 obtains the ripple voltage that is embedded in the output voltage Vout of the power converter 30, step 72, where the ripple voltage may be obtained as the peak-to-peak voltage Vp2p provided by the subtracting module 56 of the ripple eliminator unit 38.

The ripple current determining element 70 of the resistance determining unit 44 in turn determines a ripple current Ip2p in the choke based on the output voltage Vout, the inductance L of the choke and operational switching data of the power converter 30, step 73.

It is for instance possible to determine the ripple current as $$I_{p2p} = \frac{V_{out}}{L}(1-D)T \tag{1}$$

where Vout is the output voltage, D is the duty cycle of the power converter 30, T is the switching period of the power converter 30 and L is the inductance of the choke, where the duty cycle D and period T are examples of operational switching data of the power converter.

In many cases the inductance L is known from the design and manufacturing, hence the division can be avoided by multiplying with its reciprocal $L_p$ yielding:

$$I_{p2p} = L_p V_{out}(1-D)T \tag{2}$$

As an alternative the computation can use an up-slope equation, which may require measuring the input voltage as well.

$$I_{p2p} = L_p(V_{in} - V_{out})DT \tag{3}$$

It is thereafter possible for the equivalent series resistance estimating element 71 of the resistance determining unit 44 to estimate the equivalent series resistance (ESR) R based on the ripple voltage Vp2p, ripple current Ip2p and the operational switching data, step 74, where the operational switching data may additionally be used for determining how and in which way the resistance determination could be simplified.

The determination of the ESR may more particularly be performed based on various equations of the ripple voltage.

One equation that defines the relationship between ripple voltage, operational switching data and the ripple current is the following equation (4), which can be found in "Output voltage Ripple Waveform Derivation, Application Report" by Surinder P Singh, SLVA-630A, January 2014, Texas instrument, which document is here incorporated by reference. In this document, the minimum ripple voltage is calculated as $$V_{out-min} = -\frac{I_{p2p}R^2C}{T_{on}} - \frac{I_{p2p}}{2CT_{on}}\left[\left(\frac{T_{on}}{2}\right)^2 - (RC)^2\right] \tag{4}$$

where Ip2p is the ripple current, R is the ESR value, C is the capacitance and Ton=DT.

Here it can be seen that the minimum voltage is obtained at the time $$t_{min} = \frac{T_{on}}{2} - RC \tag{5}$$

The maximum ripple voltage is obtained as $$V_{out-max} = \frac{I_{p2p}R^2C}{T_{off}} + \frac{I_{p2p}}{2CT_{off}}\left[\left(\frac{T_{off}}{2}\right)^2 - (RC)^2\right] \tag{6}$$

where $T_{off} = (1-D)T$.

The maximum voltage is obtained at the time:

$$t_{max} = \frac{T_{off}}{2} - RC \tag{7}$$

where the peak to peak ripple voltage becomes $$V_{p2p} = V_{out-max} - V_{out-min} == \frac{I_{p2p}R^2C}{T_{off}} + \frac{I_{p2p}}{2CT_{off}}\left[\left(\frac{T_{off}}{2}\right)^2 - (RC)^2\right] + \frac{I_{p2p}R^2C}{T_{on}} + \frac{I_{p2p}}{2CT_{on}}\left[\left(\frac{T_{on}}{2}\right)^2 - (RC)^2\right] \tag{8}$$

It can here be seen that equation (8) is an expression defining the dependency between the ripple current Ip2p, the output voltage Vout, operational switching data D. T and the equivalent series resistance R, where the operational switching data is embedded in the values Ton and Toff representing on and off times in switching performed in the converter. Thereby the on and off times Ton. Toff also depend on the operational switching data D and T, where the on time Ton is equal to the switching period T times the duty cycle D and the off time Toff is equal to the switching period T times the difference between one and the duty cycle D. It can also be seen that RC is a time constant. This equation (8) may be simplified in a number of ways depending on the size of the time constant RC compared with the values of Ton and Toff or rather as compared with two estimated time constants corresponding to the on and off times Ton, Toff, where a first estimated time constant is Ton/2 and a second estimated time constant is Toff/2.

When studying equation (8) it can also be seen that it comprises a first term $$\left[\left(\frac{T_{off}}{2}\right)^2 - (RC)^2\right]$$

defining a difference between a first parameter $$\left(\frac{T_{off}}{2}\right)^2$$

and a second parameter $(RC)^2$ and a second term $$\left[\left(\frac{T_{on}}{2}\right)^2 - (RC)^2\right]$$

defining a difference between a third parameter $$\left(\frac{T_{on}}{2}\right)^2$$

and the second parameter $(RC)^2$, where the first parameter depends on the off time Toff, the second parameter depends on the time constant RC and the third parameter depends on the on time Ton. It can also be seen that the first parameter is the square of the first estimated time constant, the second parameter is the square of the time constant RC and the third parameter is the square of the second estimated time constant.

In a first simplification of the equation (8) the time constant RC is assumed to be higher than both Ton/2 and Toff/2, i.e. higher than both the estimated time constants.

Therefore the first simplification is based on the following assumption:

$$\frac{T_{on}}{2} < RC \text{ and } \frac{T_{off}}{2} < RC.$$

For this assumption $t_{min} = t_{max} = 0$. This simplifies equation (8) above into:

$$V_{p2p} = I_{p2p}R \qquad (9)$$

$$R = \frac{V_{p2p}}{I_{p2p}} \qquad (10)$$

It can thus be seen that the first simplification defines the resistance R as the ripple voltage Vp2p divided by the ripple current Ip2p.

In case the assumption $$\frac{T_{on}}{2} < RC \text{ and } \frac{T_{off}}{2} < RC$$

is valid, the calculation represents a good approximation of the ESR.

Alternatively Ip2p can be measured or calculated using $$I_{p2p} = \frac{V_{out}}{L}(1-D)T \qquad (11)$$

which when inserted in equation (10) leads to:

$$R = \frac{V_{p2p}}{I_{p2p}} = \frac{V_{p2p}L}{V_{out}} \frac{F}{(1-D)} \qquad (12)$$

where F is the switching frequency, which is also an example of operational switching data.

A second simplification that may be used is based on the assumption that the time constant RC is considered to be lower than both Ton/2 and Toff/2, i.e. lower than both the estimated time constants.

Thus $$t_{min} = \frac{T_{on}}{2} - RC > 0 \text{ and } t_{max} = \frac{T_{off}}{2} - RC > 0.$$

In this case the Voltage peak to peak value equation (8) may be simplified to $$V_{p2p} = \frac{TI_{p2p}}{8C} + \frac{I_{p2p}R^2C}{2D(1-D)T} \qquad (13)$$

Solving for $R^2$ we obtain $$R^2 = \frac{2D(1-D)T}{C}\left[\frac{V_{p2p}}{I_{p2p}} - \frac{T}{8C}\right] \qquad (14)$$

This equation can be used directly and thereby avoiding the square root to be calculated. Alternatively the square root is calculated and the R is obtained.

In case the assumption $$t_{min} = \frac{T_{on}}{2} - RC > 0 \text{ and } t_{max} = \frac{T_{off}}{2} - RC > 0$$

is valid, the calculation represents a good approximation of the ESR.

Alternatively Ip2p may be measured or calculated using equation (11).

If the expression in equation (11) is inserted into equation (14) we obtain:

$$R^2 = \frac{2D(1-D)T}{C}\left[\frac{LV_{p2p}}{V_{out}(1-D)T} - \frac{T}{8C}\right] = \qquad (15)$$

$$\frac{2D}{C}\frac{LV_{p2p}}{V_{out}} - \frac{T^2}{8C^2}2D(1-D) == \frac{2D}{C}\frac{LV_{p2p}}{V_{out}} - \frac{T^2}{8C^2}2D(1-D) =$$

$$\frac{2D}{C}\left[\frac{LV_{p2p}}{V_{out}} - \frac{T^2(1-D)}{8C}\right]$$

A third and a fourth simplification that may be used is based on the time constant being smaller than one of Ton/2 and Toff/2. A further simplification is thus used if the time constant RC is assumed to be higher than one of the estimated time constants, but lower than the other.

In a third simplification the assumption may more particularly be $$RC > \frac{T_{on}}{2} \text{ and } RC < \frac{T_{off}}{2}.$$

In this case equation (8) may be simplified into:

$$V_{p2p} = \frac{I_{p2p}R^2C}{T_{off}} + \frac{I_{p2p}}{2CT_{off}}\left[\left(\frac{T_{off}}{2}\right)^2 - (RC)^2\right] + \frac{I_{p2p}R}{2} \quad (16)$$

a second order polynomial equation in R. Solving for R we obtain two solutions $$R = \begin{cases} -\frac{T_{off}}{2CI_{p2p}}\left[I_{p2p} - 2\sqrt{\frac{2CI_{p2p}V_{p2p}}{T_{off}}}\right] \\ -\frac{T_{off}}{2CI_{p2p}}\left[I_{p2p} + 2\sqrt{\frac{2CI_{p2p}V_{p2p}}{T_{off}}}\right] \end{cases} \quad (17)$$

The lowest solution is always negative and obvious not physically correct. Hence $$R = \frac{T_{off}}{CI_{p2p}}\left[\sqrt{\frac{2CI_{p2p}V_{p2p}}{T_{off}}} - 2I_{p2p}\right] \quad (18)$$

Using this R it may be necessary to check that the assumption of the time constant was correct.

A fourth simplification is based on the other intermediate RC condition:

Assume $$RC < \frac{T_{on}}{2} \text{ and } RC > \frac{T_{off}}{2},$$

then equation (8) simplifies to:

$$V_{p2p} = \frac{I_{p2p}R^2C}{T_{on}} + \frac{I_{p2p}}{2CT_{on}}\left[\left(\frac{T_{on}}{2}\right)^2 - (RC)^2\right] + \frac{I_{p2p}R}{2} \quad (19)$$

This is solved for R and only showing the positive solution which yields $$R = \frac{T_{on}}{2CI_{p2p}}\left[2\sqrt{\frac{2CI_{p2p}V_{p2p}}{T_{on}}} - I_{p2p}\right] \quad (20)$$

This is the same solution as in the third simplification, with the exception that Ton is used instead of Toff. Using this R it may then be necessary to check that the assumption of the time constant was correct.

According to various aspects it is possible to use one, two or more of the different simplifications in order to estimate the ESR.

In a second embodiment, only the first simplification is used.

The capacitors available on the market and that are used in various SMPS applications are limited into certain ESR and capacitance ranges.

For example the ESR may be in the range 2 to 25 mΩ and the capacitance range may be 100 to 1500 µF. This would yield the time constant range of 0.2 µs to 37 µs. For a typical application with Vin=12 and Vout=1 V switched at 320 kHz the ideal estimated time constants or half on time and off times would become.

$$\frac{T_{on}}{2} = 0.13us,$$

$$\frac{T_{off}}{2} = 1.43us$$

Hence the time constants of the capacitors are larger than these times and the first simplification can be used to calculate the ESR.

This means that in this case the RC time constant is determined to be higher than both Ton/2 and Toff/2, which led to the use of equation (10) or (12).

Figure 7:
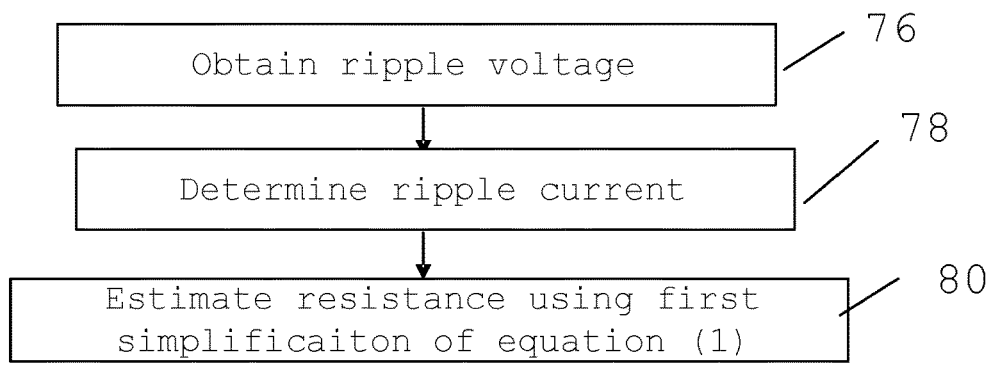
FIG. 7 shows a flow chart of method steps used for determining the equivalent series resistance according to a second embodiment.

The functioning of this second embodiment being performed by the resistance determining unit 44 will now be described with reference also being made to FIG. 7, which shows a flow chart outlining the method steps of this embodiment.

Also in this embodiment the ripple voltage obtaining element 69 of the resistance determining unit 44 obtains the ripple voltage embedded in the output voltage Vout of the power converter 30, step 76. The ripple voltage may yet again be obtained as the peak-to-peak voltage Vp2p provided by the subtracting module 56 of the ripple eliminator 38.

The ripple current determining element 70 of the resistance determining unit 44 in turn determines a ripple current Ip2p in the choke based on the output voltage Vout, the inductance L of the choke and operational switching data of the power converter 30, step 78, where equation (1), (2) or (3) may again be used.

Thereafter the equivalent series resistance R is estimated by the equivalent series resistance determining element 71, step 80, which may be done using equation (10) or (12).

It can thus be seen that in this case the series resistance can be determined fast and easily with a small amount of processing power.

It is possible to simplify the calculations being made according to the first simplification even further.

When looking at equation (12) it can be seen that it has the parameters F, L and Vout. If these are known then equation (12) may be simplified into $$R = \frac{V_{p2p}L}{V_{out}}\frac{F}{(1-D)} = \frac{V_{p2p}}{(1-D)}k, \quad (21)$$

where $k = \frac{FL}{V_{out}}.$

It can thus be seen that the first simplification comprises an expression that depends on the switching frequency F, the inductance L and the output voltage Vout. The expression is provided as a constant k, which may be pre-computed and stored in a constant store of the resistance determining unit 44. Hence, the calculations are reduced into one subtraction, one division and one multiplication, which reduces the processing even further.

If the actual duty cycle determined by the controller in steady state is not used in the calculations, one can approximate the duty cycle to be the ideal duty cycle determined by the output and input voltage ratio, i.e. by $$D_{ideal} = \frac{V_{in}}{V_{out}}$$

and then $$R = \frac{V_{p2p}}{I_{p2p}} = V_{p2p} \frac{V_{in}FL}{(V_{in}V_{out} - V_{out}^2)} = V_{p2p}c \quad (22)$$

is obtained, where $$c = \frac{V_{in}FL}{(V_{in}V_{out} - V_{out}^2)}$$

There is thus a constant c, which in addition to depending on the switching frequency F, the inductance L and the output voltage Vout is also dependent on the input voltage Vin. In applications where all the variables in c are known, c can also be pre-computed and stored in the constant memory, thereby avoiding even more time consuming calculations.

$$R = V_{p2p}c \quad (23)$$

It can thus be seen that this would reduce the required processing even further.

The above mentioned constants may be used also in relation to the second, third and fourth simplifications and reduce also the processing performed there. Obviously the amount of processing required is not as low as in the first embodiment.

Figure 8:
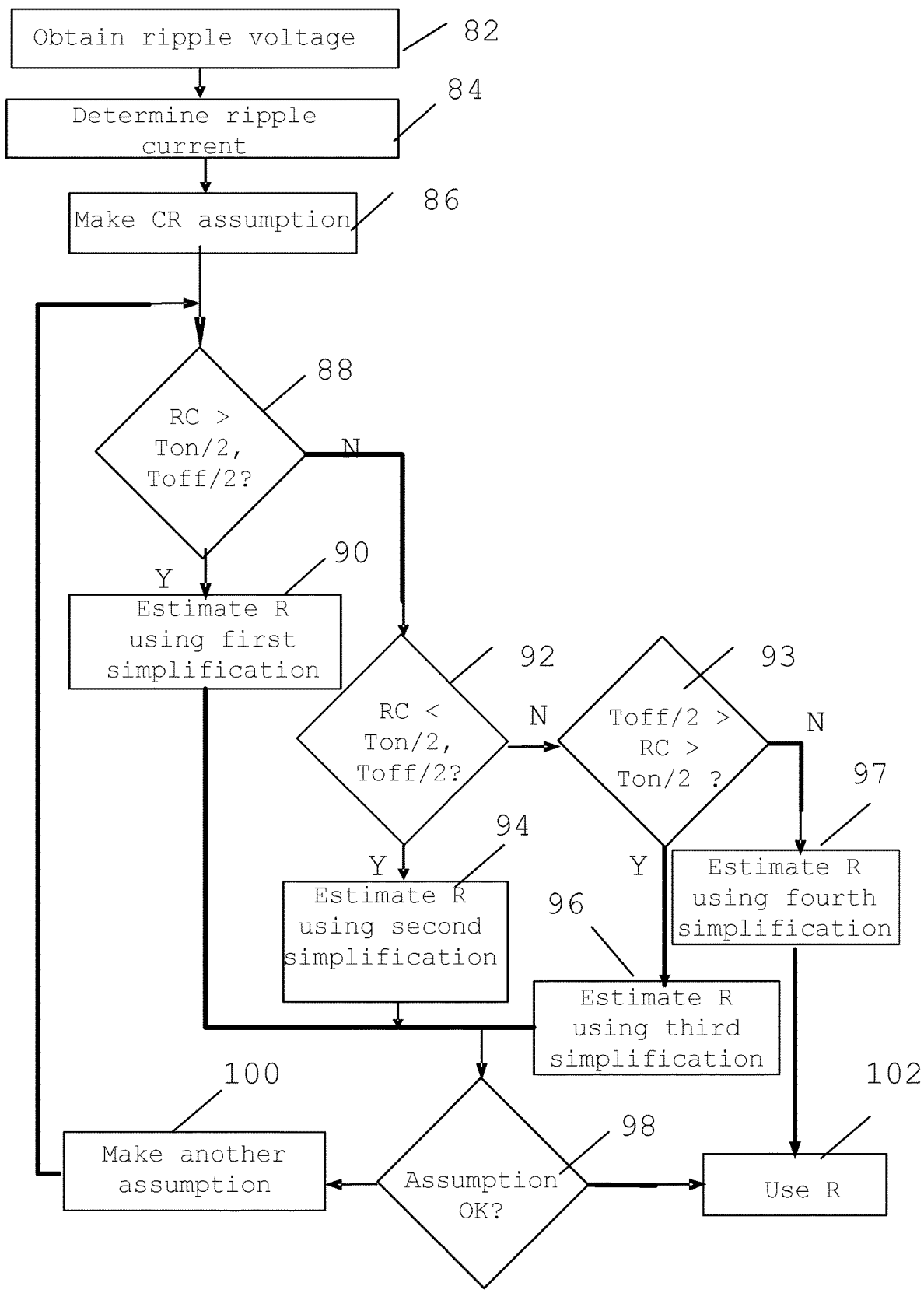
FIG. 8 shows a flow chart of method steps used for determining the equivalent series resistance according to a third embodiment.

Now a third embodiment will be described in relation to FIG. 8, which shows a flow chart of a number of method steps being performed by the resistance determining unit 44. In the embodiment the first, second, third and fourth simplifications are used. It should however be realized that it is possible to modify the method so that fewer simplifications are used. It is as an example possible that only two simplifications are used. It is for instance possible that only the first and the second simplifications are used.

It should also be realized that the order in which the simplifications are being investigated may be changed.

In this third embodiment, the ripple voltage obtaining element 69 of the resistance determining unit 44 obtains the ripple voltage embedded in the output voltage Vout of the power converter 30, step 82, where the ripple voltage may yet again be obtained as the peak-to-peak voltage provided by the subtracting module 56 of the ripple eliminator 38.

The ripple current determining element 70 of the resistance determining unit 44 also determines a ripple current Ip2p in the choke based on the output voltage Vout, the inductance L of the choke and operational switching data of the power converter 30, step 84, where equation (1), (2) or (3) may again be used.

Thereafter the equivalent series resistance determining element 71 of the resistance determining unit 44 performs a number of operations in order to estimate the equivalent series resistance.

First it makes an assumption about how big the RC time constant is, step 86. As a non-limiting example it here first assumes that it is higher than both Ton/2 and Toff/2. The equivalent series resistance determining element 71 of the resistance determining unit 44 thus here first assumes that the first simplification is valid.

Thereafter it investigates which assumption that has been made. If the assumption is that the RC constant is higher than both Ton/2 and T/off/2, step 88, then the resistance determining unit estimates the equivalent series resistance (ESR) using the first simplification, step 90, which is thus done using equation (10), (12), (21) or (22).

The equivalent series resistance determining element 71 of the resistance determining unit 44 then investigates if the assumption was a valid assumption. This may be done through using the calculated R to check if $$\frac{T_{on}}{2} < RC \text{ and } \frac{T_{off}}{2} < RC$$

are true.

If the assumption is valid, step 98, then R is used, step 102, while if it is not, step 98, then another assumption is made, step 100. It can thereby be seen that the resistance determining unit 44, after having estimated the resistance R according to a simplification, investigates if the assumption was correct using the calculated resistance, and if it was not, then it uses another assumption and consequently also another simplification.

In this embodiment, the next assumption is that the RC constant is smaller than both Ton/2 and Toff/2.

Thereafter the equivalent series resistance determining element 71 goes back and investigates if the constant RC was assumed to be higher than both Ton/2 and Toff/2. As it is not, step 88, the equivalent series resistance determining element 71 proceeds with another investigation, namely the investigation of if the constant RC was assumed to be lower than both Ton/2 and Toff/2.

In case it is, step 92, and therefore the equivalent series resistance determining element 71 continues and estimates the ESR using the second simplification, step 94, i.e. through either using equation (14) or (15) and possibly also employing a further simplification using constants described in relation to the second embodiment.

Thereafter it continues and investigates the validity of the assumption. In this case it investigates if $$t_{min} = \frac{T_{on}}{2} - RC > 0 \text{ and } t_{max} = \frac{T_{off}}{2} - RC > 0$$

using the new calculated R or $R^2$.

If the assumption is valid, step 98, them R is used, step 102, while if it is not, step 98, then another assumption is made, step 100. In this embodiment, the new assumption is that the RC constant is higher than Ton/2 but lower than Toff/2.

Then the equivalent series resistance determining element 71 goes back and investigates if the assumption is that the constant RC is higher than both Ton/2 and Toff/2. As it is not, step 88, the equivalent series resistance determining element 71 proceeds with another investigation, namely the investigation of if the constant RC was assumed to be lower than both Ton/2 and Toff/2. As this is not the case, step 92, it then investigates if the assumption is that the constant RC was higher than Ton/2 but lower than Toff/2. In the present example, this is now the case, step 93, and therefore the equivalent series resistance determining element 71 estimates R using the third simplification, step 96, i.e. using equation (18).

This is then followed by investigating the validity of the assumption. The calculated value of R is thus used to see if tmin will be higher than Ton/2 and lower than Toff/2. If this is the case, step 98, then the estimated value is used, step 102, while if it is not, step 98, then another assumption is made, step 100. In this case there is only one assumption left and that is that the RC constant is lower than Ton/2 but higher than Toff/2.

Then the equivalent series resistance determining element 71 goes back and investigates if the assumption is that the constant RC is higher than both Ton/2 and Toff/2. As it is not, step 88, the equivalent series resistance determining element 71 proceeds with the investigation of if the constant RC was assumed to be lower than both Ton/2 and Toff/2. As this is not the case, step 92, it then investigates if the assumption is that the constant RC was higher than Ton/2 but lower than Toff/2, as this was also not the case, step 93, the series resistance is now estimated using the fourth simplification, step 97, i.e. using equation (20). Now there is no need to perform any validity check, but the value R may be directly used, step 102.

It can thus be seen that the equivalent series resistance R is calculated for any type of assumption, which ensures that a good estimate is guaranteed, which is of advantage if no assumptions can be made safely.

It should be realized that it is possible that one or more of the different simplifications of the third embodiment are being investigated in parallel, in order to speed up processing.

It should be realized that the converter may be any type of converter. It may thus be an AC/DC converter, a DC/DC converter, a DC/AC converter or an AC/AC converter.

The ripple voltage obtaining element of the resistance determining unit may also be considered to be means for obtain a ripple voltage embedded in an output voltage of the power converter, The ripple current determining element of the resistance determining unit may also be considered to be means for determining a ripple current based on the output voltage, the inductance and operational switching data of the power converter.

The equivalent series resistance determining element of the resistance determining unit may be considered to be means for estimating the equivalent series resistance of the power converter based on the ripple voltage, ripple current and the operational switching data.

The means for estimating the equivalent series resistance may also be means for estimating the resistance based on a first simplification of an expression defining the dependency between the ripple current, the output voltage, operational switching data and the equivalent series resistance.

The means for estimating of the resistance based on the first simplification may be means for using the first simplification if a time constant formed by the resistance and capacitance is assumed to be higher than two estimated time constants corresponding to on and off times in switching performed in the converter.

The means for estimating the resistance may comprise means for estimating the resistance using a second simplification if the time constant is assumed to be lower than both the estimated time constants. The resistance determining unit may then also comprise means for, after having estimated the resistance according to a simplification, investigate if the assumption was correct using the calculated resistance, and if it was not, to use another simplification.

The means for estimating the resistance may comprise means for using a further simplification of the equation if the time constant is assumed to be higher than one of the estimated time constants, but lower than the other.

The resistance determining unit may furthermore comprise means for obtaining ripple components of the output voltage through locating the maximum and minimum values of ripple voltage values stored in a ripple storing buffer during the operation of the power converter and means for forming the ripple voltage as the difference between the maximum and minimum values.

While the invention has been described in connection with what is presently considered to be most practical and preferred embodiments, it is to be understood that the invention is not to be limited to the disclosed embodiments, but on the contrary, is intended to cover various modifications and equivalent arrangements. Therefore the invention is only to be limited by the following claims.

The invention claimed is:

1. An apparatus operable with a power converter having power train parameters including a capacitance (C) and an inductance (L), comprising:
   a processor configured to:
      obtain a ripple voltage embedded in an output voltage ($V_{out}$) of said power converter;
      determine a ripple current based on said output voltage, said inductance and operational switching data of said power converter; and,
      estimate an equivalent series resistance (ESR) of said power converter based on said ripple voltage, said ripple current, and said operational switching data, said estimating employing a mathematical expression that is a function of said ripple voltage and said ripple current, and wherein at least one simplification of said expression is employed to estimate said ESR, wherein:
         a first simplification of said expression is used if an estimated RC time constant formed by said ESR and said capacitance is higher than first and second time constants corresponding to on and off times, respectively, of switching performed in said power converter, said on and off times being dependent on said operational switching data;
         a second simplification of said expression is used if said estimated RC time constant is lower than said first and second time constants; and,
         a third simplification of said expression is used if said estimated RC time constant is higher than only one of said first and second time constants.

2. The apparatus as recited in claim 1, wherein said operational switching data comprises a duty cycle (D) and a switching period (T), said on time being equal to said switching period times said duty cycle, and said off time being equal to said switching period times a difference between one and said duty cycle.

3. The apparatus as recited in claim 1, wherein said first simplification comprises a part that depends on a switching frequency (F) of said power converter, said inductance and said output voltage, wherein the ESR is calculated using the expression:

$$R = \frac{V_{p2p}}{I_{p2p}} = \frac{V_{p2p}L}{V_{out}} \frac{F}{(1-D)}$$

wherein $V_{p2p}$ is a peak-to-peak ripple voltage, $I_{p2p}$ is a peak-to-peak ripple current, and D is the duty cycle of said power converter.

4. The apparatus as recited in claim 1, wherein said ripple voltage represents a peak-to-peak value ($V_{p2p}$) formed as a difference between maximum ($V_{out-max}$) and minimum ($V_{out-min}$) ripple voltage components, and said mathematical expression comprises:

$$V_{p2p} = V_{out-max} - V_{out-min} = = \frac{I_{p2p}R^2C}{T_{off}} +$$

$$\frac{I_{p2p}}{2CT_{off}}\left[\left(\frac{T_{off}}{2}\right)^2 - (RC)^2\right] + \frac{I_{p2p}R^2C}{T_{on}} + \frac{I_{p2p}}{2CT_{on}}\left[\left(\frac{T_{on}}{2}\right)^2 - (RC)^2\right]$$

wherein $I_{p2p}$ represents said ripple current, R represents said ESR, C represents said capacitance, and $T_{on}$ and $T_{off}$ comprise said operational switching data, wherein $T_{on}$ is an on time equal to the product of a switching period T and a duty cycle D, and $T_{off}$ is an off time equal to the product of said switching period and 1-D, of said power converter.

5. The apparatus recited in claim 1, wherein said operational switching data is a function of the switching frequency of the power converter.

6. The m apparatus ethod as recited in claim 1, wherein, when said second simplification of said expression is used, said ESR is calculated using the expression:

$$R^2 = \frac{2D(1-D)T}{C}\left[\frac{V_{p2p}}{I_{p2p}} - \frac{T}{8C}\right]$$

wherein $V_{p2p}$ is a peak-to-peak ripple voltage, $I_{p2p}$ is a peak-to-peak ripple current, D is the duty cycle, and T is the switching period of said power converter.

7. The apparatus as recited in claim 1, wherein, when said third simplification of said expression is used, said ESR is calculated using the expression:

$$R = \frac{T_{off}}{CI_{p2p}}\left[\sqrt{\frac{2CI_{p2p}V_{p2p}}{T_{off}}} - 2I_{p2p}\right],$$

wherein $V_{p2p}$ is a peak-to-peak ripple voltage, $I_{p2p}$ is a peak-to-peak ripple current, and $T_{off}$ is an off time equal to the product of the switching period (T) and the difference between one and the duty cycle (D) of said power converter.

8. The apparatus as recited in claim 1, wherein, when said third simplification of said expression is used, said ESR is calculated using the expression:

$$R = \frac{T_{on}}{CI_{p2p}}\left[2\sqrt{\frac{2CI_{p2p}V_{p2p}}{T_{on}}} - I_{p2p}\right],$$

wherein $V_{p2p}$ is a peak-to-peak ripple voltage, $I_{p2p}$ is a peak-to-peak ripple current, and $T_{on}$ is an on time equal to the product of the switching period (T) and the duty cycle (D) of said power converter.

9. The apparatus recited in claim 1, wherein a real-time computation of the expression is simplified by pre-storing a constant that is a function of known values of said expression.

10. The apparatus recited in claim 9, wherein said constant is a function of known values for L, $V_{out}$, and the switching frequency (F) of said power converter.

11. The apparatus recited in claim 10, wherein said constant is further a function of a known value for the input voltage ($V_{in}$) of said power converter.

12. A method operable with a power converter having power train parameters including a capacitance (C) and an inductance (L), comprising:
obtaining a ripple voltage embedded in an output voltage ($V_{out}$) of said power converter;
determining a ripple current based on said output voltage, said inductance and operational switching data of said power converter; and,
estimating an equivalent series resistance (ESR) of said power converter based on said ripple voltage, said ripple current, and said operational switching data, said estimating employing a mathematical expression that is a function of said ripple voltage and said ripple current, and wherein at least one simplification of said expression is employed to estimate said ESR, wherein:
a first simplification of said expression is used if an estimated RC time constant formed by said ESR and said capacitance is higher than first and second time constants corresponding to on and off times, respectively, of switching performed in said power converter, said on and off times being dependent on said operational switching data;
a second simplification of said expression is used if said estimated RC time constant is lower than said first and second time constants; and,
a third simplification of said expression is used if said estimated RC time constant is higher than only one of said first and second time constants.

13. The method as recited in claim 12, wherein said operational switching data comprises a duty cycle (D) and a switching period (T), said on time being equal to said switching period times said duty cycle, and said off time being equal to said switching period times a difference between one and said duty cycle.

14. The method as recited in claim 12, wherein said first simplification comprises a part that depends on a switching frequency (F) of said power converter, said inductance and said output voltage, wherein the ESR is calculated using the expression:

$$R = \frac{V_{p2p}}{I_{p2p}} = \frac{V_{p2p}L}{V_{out}} \frac{F}{(1-D)}$$

wherein $V_{p2p}$ is a peak-to-peak ripple voltage, $I_{p2p}$ is a peak-to-peak ripple current, and D is the duty cycle of said power converter.

15. The method as recited in claim 12, wherein said ripple voltage represents a peak-to-peak value ($V_{p2p}$) formed as a difference between maximum ($V_{out-max}$) and minimum ($V_{out-min}$) and maximum ripple voltage components, and said mathematical expression comprises:

$$V_{p2p} = V_{out-max} - V_{out-min} == \frac{I_{p2p}R^2C}{T_{off}} +$$

$$\frac{I_{p2p}}{2CT_{off}}\left[\left(\frac{T_{off}}{2}\right)^2 - (RC)^2\right] + \frac{I_{p2p}R^2C}{T_{on}} + \frac{I_{p2p}}{2CT_{on}}\left[\left(\frac{T_{on}}{2}\right)^2 - (RC)^2\right]$$

wherein $I_{p2p}$ represents said ripple current, R represents said ESR, C represents said capacitance, and $T_{on}$ and $T_{off}$ comprise said operational switching data, wherein $T_{on}$ is an on time equal to the product of a switching period T and a duty cycle D, and $T_{off}$ is an off time equal to the product of said switching period and 1–D, of said power converter.

16. The method recited in claim 12, wherein said operational switching data is a function of the switching frequency of the power converter.

17. The method as recited in claim 12, wherein, when said second simplification of said expression is used, said ESR is calculated using the expression:

$$R^2 = \frac{2D(1-D)T}{C}\left[\frac{V_{p2p}}{I_{p2p}} - \frac{T}{8C}\right]$$

wherein $V_{p2p}$ is a peak-to-peak ripple voltage, $I_{p2p}$ is a peak-to-peak ripple current, D is the duty cycle, and T is the switching period of said power converter.

18. The method as recited in claim 12, wherein, when said third simplification of said expression is used, said ESR is calculated using the expression:

$$R = \frac{T_{off}}{CI_{p2p}}\left[\sqrt{\frac{2CI_{p2p}V_{p2p}}{T_{off}}} - 2I_{p2p}\right],$$

wherein $V_{p2p}$ is a peak-to-peak ripple voltage, $I_{p2p}$ is a peak-to-peak ripple current, and $T_{off}$ is an off time equal to the product of the switching period (T) and the difference between one and the duty cycle (D) of said power converter.

19. The method as recited in claim 12, wherein, when said third simplification of said expression is used, said ESR is calculated using the expression:

$$R = \frac{T_{on}}{CI_{p2p}}\left[2\sqrt{\frac{2CI_{p2p}V_{p2p}}{T_{on}}} - I_{p2p}\right],$$

wherein $V_{p2p}$ is a peak-to-peak ripple voltage, $I_{p2p}$ is a peak-to-peak ripple current, and $T_{on}$ is an on time equal to the product of the switching period (T) and the duty cycle (D) of said power converter.

20. The method recited in claim 12, wherein a real-time computation of the expression is simplified by pre-storing a constant that is a function of known values of said expression.

21. The method recited in claim 20, wherein said constant is a function of known values for L, $V_{out}$, and the switching frequency (F) of said power converter.

22. The method recited in claim 21, wherein said constant is further a function of a known value for the input voltage ($V_{in}$) of said power converter.

* * * * *